United States Patent [19]

Eardley et al.

[11] 4,287,575
[45] Sep. 1, 1981

[54] HIGH SPEED HIGH DENSITY, MULTI-PORT RANDOM ACCESS MEMORY CELL

[75] Inventors: David B. Eardley, Stanfordville; Richard E. Matick, Peekskill, both of N.Y.

[73] Assignee: International Business Machines Corporation, Armonk, N.Y.

[21] Appl. No.: 108,070

[22] Filed: Dec. 28, 1979

[51] Int. Cl.³ .............................................. G11C 11/40
[52] U.S. Cl. .................................. 365/174; 365/154; 365/189; 307/238.6
[58] Field of Search ................. 365/45, 103, 104, 154, 365/174, 188, 189, 203; 307/238

[56] References Cited

U.S. PATENT DOCUMENTS 3,675,218  7/1972  Sechler .............................. 365/154

*Primary Examiner*—Terrell W. Fears
*Attorney, Agent, or Firm*—Richard E. Cummins

[57] ABSTRACT

A random access memory system is disclosed in which data stored in two distinct memory locations defined by distinct address signals can be non-destructively read out simultaneously. The system employs a matrix of two-port memory cells, each cell functioning to store one binary bit of data in a conventional cross-coupled common emitter flip-flop. A pair of input/output transistors have their emitters connected to the respective control nodes of the static cell, their bases connected to first and second word lines, and their collectors connected to first and second bit sense lines. The word lines and bit lines are addressed and pulsed such that during reading of the selected cells, current flows through only one of the input transistors of one of the cells of a sense line whereon, during writing, current flows through both of the input/output transistors, the direction of current flow during writing depending on the value of the binary bit being stored. The input/output transistors associated with each cell are integrated onto the chip and occupy only slightly more area than multi-configured devices conventionally employed in prior art two-port cells.

5 Claims, 9 Drawing Figures

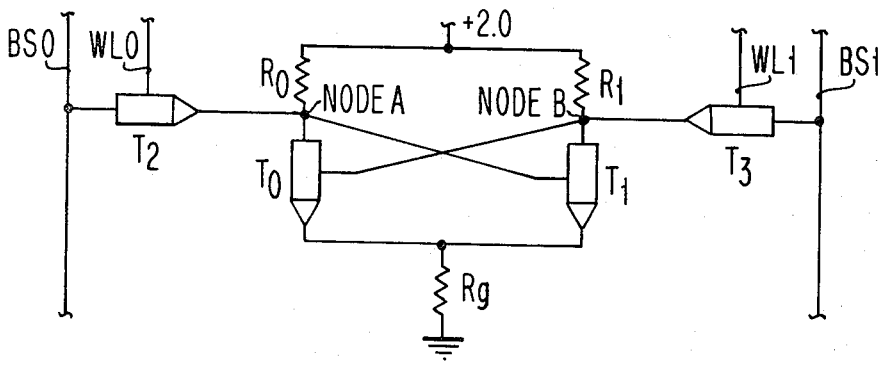

HIGH SPEED HIGH DENSITY, MULTI-PORT RANDOM ACCESS MEMORY CELL

DESCRIPTION

1. Background of the Invention

In high speed computing systems, a substantial improvement in system performance can be achieved by the use of a main memory in which two memory locations can be read out simultaneously. Various memory arrangements have been disclosed in the art which permit two simultaneous accesses during a read operation. Such arrangements are based on a specific circuit construction of a memory cell which usually involves complex, multi-element semiconductor devices other than simple, three-terminal transistors. While such devices perform the overall function required of a two-port memory cell, the placement of such cells on a semiconductor chip results in a decrease in cell density and access time which has adversely affected the cost performance comparison of such a memory array relative to conventional memories with single-port cells.

The system of the present invention is based on a two-port cell involving only four simple, three-terminal transistors which results in only a slight decrease in cell density on the chip and minimal impact on access time for reading out two cells simultaneously.

2. Summary of the Invention

A two-port memory cell is configured from four simple, three-terminal transistors and four control lines and embodied into a memory array on semiconductor chips such that external circuitry can control selectively the voltage levels on all four control lines. Two of the three terminal transistors are configured in a conventional cross-coupled common emitter flip-flop providing two stable states for the storage of one bit of binary data, such that one binary value is represented by the on-off state of the two transistors or the voltage level of their respective control nodes. The other two transistors, referred to as input/output transistors, are connected to the control nodes of the flip-flop so that, depending on the levels of the signals applied to the four control lines connected to the remaining four terminals of the input/output transistors relative to the voltage level o the control node, current is supplied to one of the control nodes during a write cycle, depending on the value of the data being written. During a read cycle, current is diverted to one of the control lines through one I/O transistor for one binary value, and blocked to that control line for the other binary value. The presence or absence of current on the one control line is independent of the presence or absence of current on the other control line so that two separate, independent indications of the value of the data stored in the cell may be obtained. Two cells can, therefore, be read out simultaneously.

BRIEF DESCRIPTION OF THE DRAWINGS

FIGS. 4a and 4b illustrate the levels of the four signals applied to a selected cell during a write operation, while FIGS. 4c through 4f illustrate the levels of the four signals applied to two selected cells during readout of the two selected cells.

DETAILED EMBODIMENT OF THE INVENTION

Figure 1:
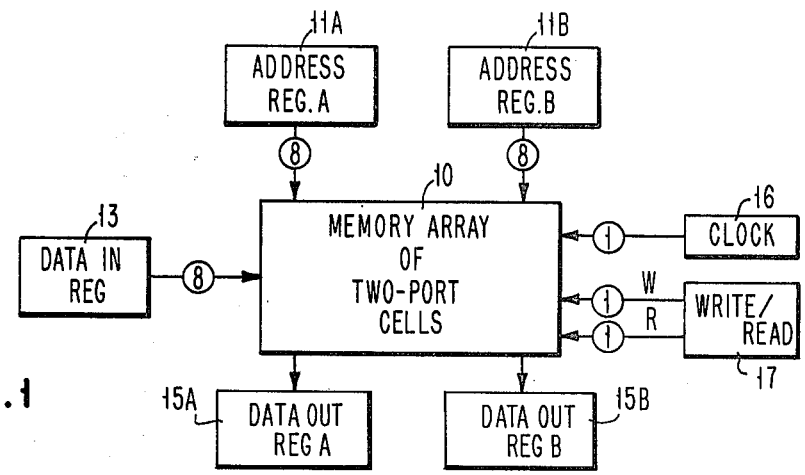
FIG. 1 illustrates in block diagram form a memory storage system embodying the present invention.

FIG. 1 shows the general arrangement of a random access memory system in which the present invention is embodied. The system shown in FIG. 1 comprises a memory array 10 of two-port cells, the structure and operation of which will be described in detail in connection with FIG. 3. The memory cells in array 10 are arranged in a conventional matrix form on a semiconductor chip, a number of such chips being associated to store an 8-bit character, each bit of which is stored on a different chip.

The system further includes a pair of address registers 11A and 11B which are identical, and each of which functions to address or select one cell in the matrix by decoding a multi-bit address into row and column coordinates of the selected cell, as is well known in the art.

The system further includes a Data In Register 13 whose function is to supply an 8-bit character to the array for storage, each bit of which is stored in a corresponding cell location of a different chip of the array.

The system also includes a pair of Data Out Registers 15A and 15B for receiving the data read out from storage locations defined by address registers 11A and 11B during a read operation.

The remaining functional blocks of the random access memory system of FIG. 1 are clock 16 and read/write control logic 17. Functional blocks 11A, 11B, 13, 15A, 15B, 16 and 17, per se, are well known in the art and, hence, the detailed circuitry of such blocks is, therefore, not illustrated or described. The detailed interaction between these blocks and the memory chip will be described in connection with FIG. 2.

Figure 2:
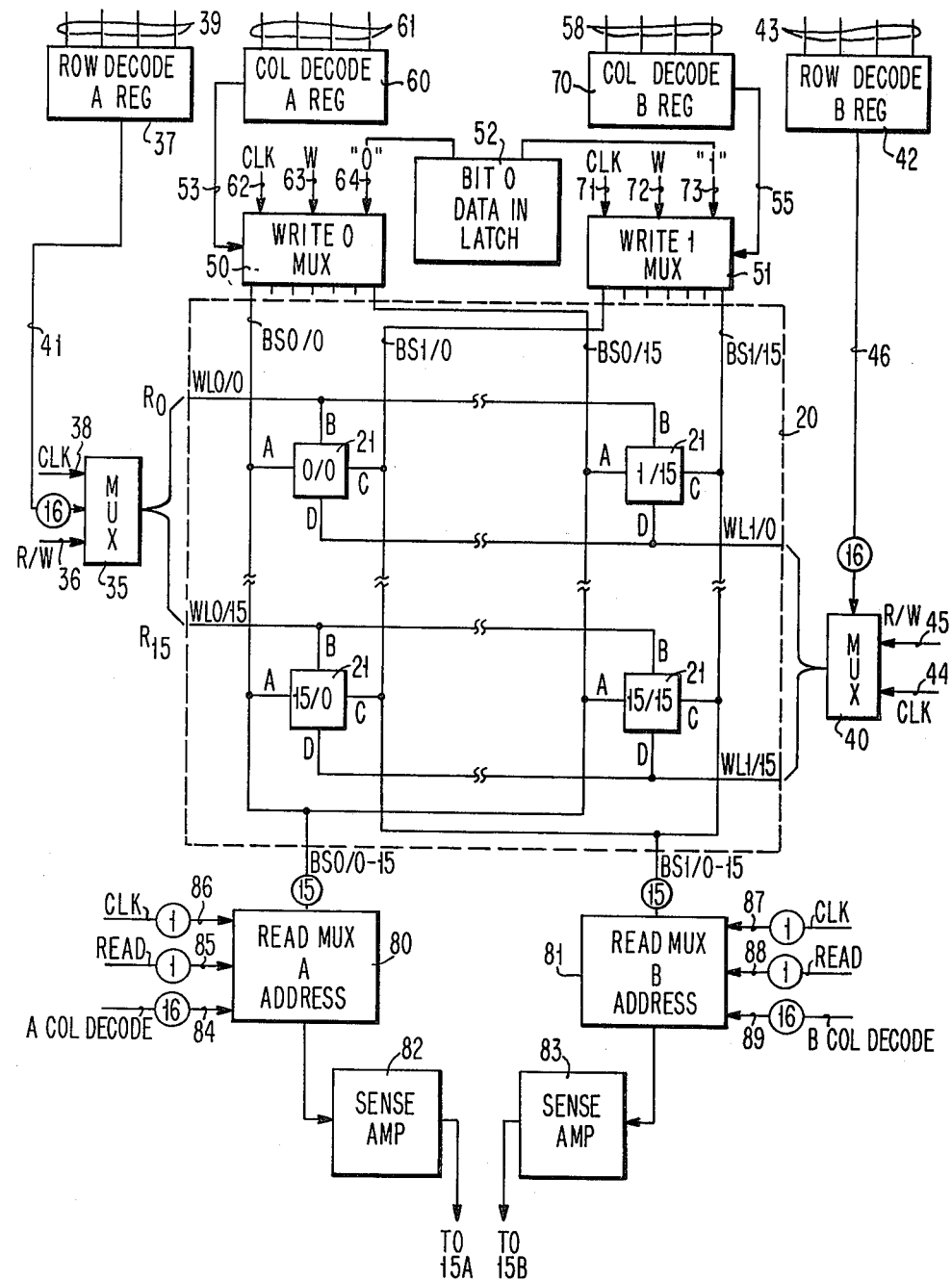
FIG. 2 illustrates in schematic detail the circuitry employed to write in an addressed cell and to read two addressed cells simultaneously from a semiconductor chip on which a plurality of the two-port cells have been disposed.

FIG. 2 illustrates schematically one chip of the memory array 10 shown in FIG. 1 and the additional circuitry associated with the chip to perform read and write operations in accordance with an embodiment of the present invention.

With reference to FIG. 2, the chip 20 comprises a 16×16 matrix of storage cells 21 disposed in rows R0 through R15 and columns C0 through C15, resulting in 256 cells, each of which is capable of storing one binary bit of data. The address of a cell in the matrix is defined by its row and column coordinates. Each cell has four control terminals designated A, B, C, and D on cell 0/0. As will be explained in connection with FIG. 3, the cell has two ports, terminals A and B defining one port, while terminals C and D define the other port.

A different pair of word lines, WL0 and WL1, are associated with each row of the matrix, while a different pair of bit sense lines, BS0 and BS1, are associated with each column of the matrix. As shown in FIG. 2, word line WL0/0, associated with row 0 of the matrix, is connected to the B control terminal of each cell in row 0, while word line WL1/0 is connected to the D terminal of each cell in row 0. As previously stated, a different pair of word lines WL0 and WL1 are similarly arranged for each row of the matrix.

Bit sense line BS0/0, associated with column 0 of the matrix, is connected to the A control terminal of each cell in column 0, while bit sense line BS1/0, associated with column 0 of the matrix, is connected to the C control terminal of each cell in column 0. A different pair of bit sense lines, BS0 and BS1, are similarly arranged for each column of the matrix.

The additional circuitry associated with the chip, as shown in FIG. 2, functions generally to select one cell during a write operation and two cells during a read operation and, during each operation, apply appropriate signal levels to the respective terminals of the cell. It will be obvious to those persons skilled in the art that, while the decoders and multiplexers, for example, are shown as separate functional blocks, their functions can be embodied in any of the various ways known in the art and still achieve the desired cell selection and signal level control to perform storage and fetching of data.

The sixteen word lines WL0 of rows 0 through 15 are connected to the output of a multiplexer 35. The inputs to multiplexer 35 are a write control signal on line 36 from the read/write control logic 17 of FIG. 1, a clock signal on line 38 from clock 16 of FIG. 1, and sixteen lines from a row decoder 37. Row decoder 37 receives four bits of address information from address register 11A of FIG. 1 on line 39, which are decoded into one of sixteen outputs on cable 41. A clock pulse is applied to the selected WL0 line when a write control signal is applied on line 36.

A similar arrangement involving multiplexer 40 and row decoder 42 is associated with the word lines WL1 on the matrix. Row decoder 42, however, receives a 4-bit signal from address register 11B on line 43. The multiplexer 40 is likewise provided with a clock signal on line 44 and a write signal on line 45. A clock pulse is applied to the selected word line WL1 when a write signal is applied on line 45. The output of decoder 42 is connected to multiplexer 40 by cable 46.

The system further comprises a write "0" multiplexer 50 and a write "1" multiplexer 51. The sixteen bit sense lines BS0/0 through BS0/15 are connected to the output of the write "0" multiplexer 50, while the sixteen bit senese lines BS1/0 through BS1/15 are connected to the output of the write "1" multiplexer 51. The input to multiplexer 50 comprises sixteen lines on cable 53 from column decoder 60 which receive a 4-bit signal on line 61 from address register 11A of FIG. 1. The input further includes a clock input signal on line 62, a write control signal on line 63, and a write "0" signal on line 64. The write "0" signal on line 64 originates from one stage of the Data In Register 13, shown in FIG. 1.

The sixteen bit sense lines BS1/0 through BS1/15 are connected to the output of multiplexer 51. The input to multiplexer 52 is sixteen lines on cable 55 from column decoder 70, which receives a 4-bit signal on line 58 from address register 11B, a clock signal on line 71, and a write signal on line 72. In addition, a write "1" signal is applied on line 73 from the stage of Data In Register 13 in FIG. 1.

The value of the bit in Data Register 13 determines if the write "0" signal or the write "1" signal is active during the period defined by the clock pulse.

The remaining portion of the system as shown in FIG. 2 comprises read multiplexer 80 and read multiplexer 81. Multiplexers 80 and 81 function to transfer signals simultaneously during a read operation from two selected cells of the matrix to sense amplifiers 82 and 83.

The inputs to the read multiplexer 80 are the sixteen output lines on cable 84 from the column decoder 60 associated with address register 11A in FIG. 1. These sixteen input lines are shown as cable 84 in FIG. 2. Additionally, a read control signal on line 85 and a clock signal on line 86 are inputs to multiplexer 80. Lastly, the bit sense lines BS0/1 through BS0/15 for each of the sixteen columns of the matrix are provided as inputs to read multiplexer 80.

The inputs to read multiplexer 81 are the sixteen output lines in cable 89 from the column decoder 70 for address register 11B, a clock signal on line 87, a read control signal on line 88, and bit sense lines BS1/0 through BS1/15 from the matrix.

The structural details of one of the cells shown in FIG. 2 will now be described in connection with FIG. 3, and its operation will be described in connection with the waveforms shown in FIGS. 4a through 4f.

Figure 3:
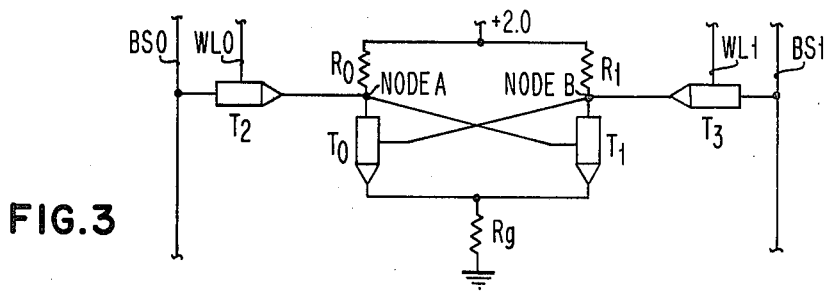
FIG. 3 illustrates in detail one of the two-part memory cells shown in FIG. 2.

The cell as shown in FIG. 3 comprises a pair of cross-coupled transistors $T_0$ and $T_1$ which have their emitters coupled to ground through a resistor $R_g$ and their collectors connected to a source of voltage through resistors $R_0$ and $R_1$, thereby defining two control nodes, A and B. For convention purposes, it is assumed that when $T_0$ is on and $T_1$ is off, a binary value of "0" is stored in the cell and that when $T_0$ is off and $T_1$ is on, a binary value of "1" is stored in the cell. The cell further comprises input/output transistors $T_2$ and $T_3$ which have their emitters coupled respectively to control nodes A and B. The base of transistor $T_2$ is connected to word line WL0 and corresponds to input terminal B of the cell, as shown in FIG. 2. The collector of transistor $T_2$ is connected to bit sense line BS0 which corresponds to terminal A of the cell, as shown in FIG. 1. The base of transistor $T_3$ is connected to word line WL1 and corresponds to input terminal D of the cell, while the collector of transistor $T_3$ is connected to bit sense line BS1, corresponding to terminal C of the cell, as shown in FIG. 2.

Figures 4A, 4B, 4C, 4D, 4E, 4F:
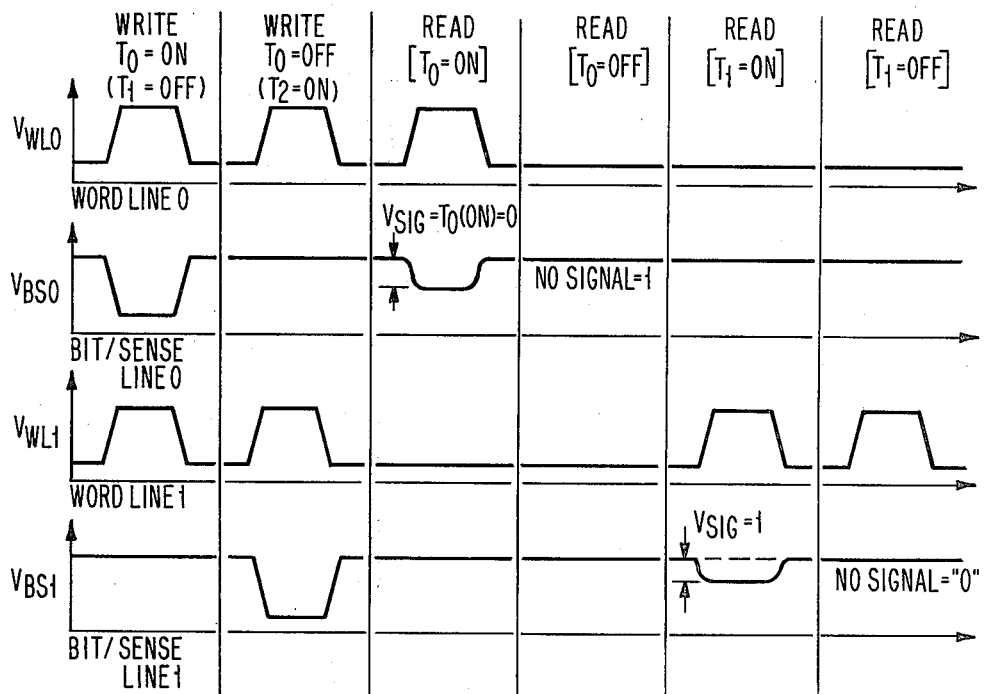

The operation of the cell is as follows. To write a "0" ($T_0$=ON; $T_1$=OFF), both word lines WL0 and WL1 are pulsed, as shown in FIG. 4a. This will "enable" both input/output transistors $T_2$ and $T_3$ for later conduction. Bit sense line BS0, which is normally high, as shown in FIG. 4a, is also pulsed negatively at the same time, as shown in FIG. 4a, while BS1 is maintained at its high state. If a binary "1" was previously stored in the cell, i.e., $T_0$=OFF and $T_1$=ON, node A would be higher than node B. Since bit sense line BS0 is low, by making use of the reverse current gain of $T_2$, current will flow out of node A through $T_2$ to BS0, which starts turning $T_1$ off. At the same time, since node B is low, and BS1 is high, current will flow through $T_3$ to node B to start to turn $T_0$ on. Once the flipping action starts, $T_1$ going off reinforces $T_0$ going on. The result is that a binary "0" is stored in the cell. The above conditions are shown in FIG. 4a. The corresponding conditions for writing a binary "1" into the cell are shown in FIG. 4b, the only difference being that bit sense line BS1 is pulsed negatively while bit sense line BS0 is maintained at its high state. The operation of $T_2$ and $T_3$ are then reversed relative to the write "0" operation.

The cell can be read out in either of two ways. The signal conditions of the four control lines are shown in FIGS. 4c and 4d of one manner of reading, while FIGS. 4e and 4f show the signal conditions for the other manner of reading. As shown, reading involves pulsing either the word lines WL0 or WL1 and sensing the condition of the associated bit sense lines BS0 or BS1. As shown in FIG. 4c, if WL0 is pulsed, the level of bit sense line BS0 drops if a binary "0" had been stored ($T_0$=ON) in the cell, and as shown in FIG. 4d, bit sense line BS0 remains at its high level if a binary "1" had been stored ($T_0$=OFF). When WL1 is used to read, as shown in FIGS. 4e and 4f, the level of bit sense line BS1 changes if a "1" had been stored and does not change if a "0" had been stored, which conditions are opposite of those occurring on bit sense line BS0 under the same assumptions.

The operation of $T_2$ and $T_3$ is as follows. Pulsing word line WL0 turns transistor $T_2$ on and, assuming the cell contains a binary "0" ($T_0$=ON) so that node A is low, sense current will flow from BS0 through $T_2$ and $T_0$ to ground. This current is sensed by a sense amplifier 82 (FIG. 2) connected to the bit sense line BS0 in the usual manner. The cell does not switch states because node B is isolated from bit sense line BS1 so that the voltage at node B does not change, which results in a non-destructive readout of the data. If a "1" had been stored in the cell ($T_0$=OFF), node A is high and, hence, no current flows to BS0. This condition is also sensed at the appropriate clock time to indicate a binary "1" by the sense amplifier 82 during readout.

The operation of $T_3$ is identical to $T_2$, but since the state of control nodes A and B are always opposite, the changes in signal levels on bit sense line BS1 reflect signal level changes opposite to similar changes on bit sense line BS0.

If the cell is read simultaneously, the cell is not disturbed because both bit sense lines BS0 and BS1 are normally high during reading and the symmetry cannot reverse the state of $T_0$ and $T_1$.

The read and write operations of the memory system shown in FIG. 2 will now be described. The various components of the system, as shown in FIG. 2, other than the memory array itself, provide basically two major functions, namely, selection of one cell during a write operation, and selection of two cells during a read operation, plus selective control of the signals supplied to the four terminals A, B, C, and D of the cells selected during the write or read operation.

A Write Operation

Assume, for example, that it is desired to write data into cell 15/15 in the lower righthand corner of the matrix. Under such an assumption, address register A is supplied with an all "1's" character, as is address register B. The row decoder 39 for address register 11A decodes the 4-bit pattern of all "1's" into a row 15 word line WL0/15 signal which is supplied to multiplexer 35. Since address register B has the same address, row decoder 42 supplies a signal to multiplexer 40, which selects word line WL1/15. These signals condition corresponding gates in each multiplexer 35 and 40. A write control signal is applied on lines 36 and 45 to the same input of the gates in the multiplexer.

The column decoder associated with the address registers 11A and 11B similarly condition gates connected to bit sense lines BS0/15 and BS1/15, attached to multiplexers 50, 51. Each of these gates are also conditioned by the write control signal and the output of one stage of the Data In Register 13. Assuming a "1" is stored in the data register 13, the gate in the write "1" multiplexer is further conditioned when a clock pulse is applied to the write "1" multiplexer, on line 62. When a clock pulse is applied to the four multiplexers, the four control lines assume the state shown in FIG. 4b. If the data register had contained a "1," the appropriate gate in the write "0" multiplexer would have been conditioned to provide the signal levels shown in FIG. 4a.

A Read Operation

Since a read operation involves addressing two cells, it will be assumed that different addresses are placed in address registers 11A and 11B. The row decoders operate as previously described in connection with a write operation. Assuming row 0 is selected by address register A and row 15 is selected by address register B, the respective gates in the multiplexers 35 and 40 are suitably conditioned. A read control pulse is also supplied to these respective gates on lines 36 and 45 so that when a clock pulse is provided, word line WL0 of row 0 is pulsed, and word line WL1 of row 15 is pulsed. Sense signals, therefore, appear on all BS0 sense lines associated with row 0 and all BS1 sense lines associated with row 15 of the matrix, and are supplied to read multiplexer 80 and read multiplexer 81. The signals from the addressed cells are selected by column in accordance with the signals supplied to the multiplexers from the column decoders 60 and 70. The state of the signal on BS0/0 is sampled by the sense amplifier 82 and indicates, in accordance with the predetermined convention, the value of the bit stored in the cell addressed by register A.

Read multiplexer 81 operates to select the bit sense line BS1/15 under control of the column address signal from decoder 70 from the B address register, and senses according to its convention the value of the bit that is stored in cell 15/15.

The above system increases the read capability of a random access integrated circuit memory by 100% with only about a 15% decrease of cell density and access speed. The use of such a memory in high speed computing systems results in substantial overall performance of the computing system for a minimal of extra cost.

While the invention has been particularly shown and described with reference to the preferred embodiment thereof, it will be understood by those skilled in the art that various changes in the form and details may be made therein without departing from the spirit and scope of the invention. For example, the transistors $T_2$ and $T_3$ each may be reversed relative to the control nodes to which they are connected so that instead of employing the reverse current gain of the transistors for writing and forward current gain for reading, reverse current gain can be employed for reading while forward current gain can be employed for writing.

Having thus described our invention, what we claim as new, and desire to secure by Letters Patent, is:

1. In a random access memory system comprising a plurality of bit storage cells any two of which are individually addressable during a reading operation to simultaneously provide to first and second sense amplifiers, signals corresponding to the binary value of the data stored in said cells at said two addressed locations, said locations being defined by two separate address signals;

each of said cells comprising a first pair of cross-coupled transistors having their respective emitters connected to ground through a common resistor and their respective collectors connected to a predetermined voltage source through associated resistors, whereby two control nodes are established for controlling which of said transistors is placed in a conducting state, the improvement comprising in combination:

first and second input/output transistors each having its emitter connected to a different control node, a pair of word lines for each row of said matrix and a pair of sense lines for each column of said matrix, means connecting one of said pair of said word lines associated with each row to the base of each said first input/output transistor in said row, and the other word line of said pair of word lines to the base of each of said second input/output transistors in said row, means connecting one of said pair of sense lines associated with each column to the collector of each of said first input/output transducers in said column, and the other one of said pair of sense lines associated with said column to the collector of each said second input/output transistor in said column, means for pulsing one of said word lines connected to the base of said first input/output transistor and means for simultaneously pulsing one of said word lines connected to the base of said second input/output transistor whereby each cell in the row associated with said pulsed word line connected to the base of said first input/output transistors causes a change in signal level on the sense line associated with said first input/output transistor if said cell contained one binary value and no change in signal level if said cell contained the other binary value, and each cell in the row associated with said pulsed word line connected to said second input/output transistor causes a change in signal level of the sense line associated with said second input/output transducer if said cell contains said other binary value and no change in signal level if said cell contained said one binary value, and if said cell contained said one binary value, and means responsive to said first and second address signals for selecting one first and second sense line to be sensed.

2. In a random access memory system comprising a plurality of memory cells each of which includes a bistable semiconductor circuit having first and second control nodes, the improvement comprising:

first and second three-terminal transistors for each cell each having an emitter connected to a different said control node;

a first pair of control lines connected respectively to the base terminals of said transistors and a second pair of control lines connected respectively to the collector terminals of said transistors;

means connected to said control lines to normally bias said first and second transistors to an off condition when said memory is neither reading nor writing;

means selectively operable during a write operation for pulsing said first pair of lines simultaneously to permit current to flow between said first and third terminals of said first and second transistors; and means under control of the value of the bit of data to be stored in a cell for selecting one line of said second pair of control lines to be pulsed concurrently to cause current to flow between the control nodes and the collectors of both of said transistors through said transistors to cause said bistable device to toggle if the value stored in said cell is different than the value of the bit of data to be stored.

3. In a random access memory system comprising a matrix of memory cells each of which includes a bistable semiconductor circuit having first and second control nodes, the improvement comprising:

first and second three-terminal transistors for each cell each having a first terminal connected to one of said control nodes;

means for applying four separate signals to said second and third terminals of said first and second transistors during a reading and during a writing operation; and means for controlling the relative levels of said separate signals applied to said second and third terminals during said operations to cause current to flow through at least one of said transistors in the reverse direction for one of said operations.

4. The combination recited in claim 3 in which said first terminal is the emitter of said first and second transistors.

5. The combination recited in claim 3 in which said first terminal is the collector of said first and second transistors.

* * * * *